(12) United States Patent
Chandler

(10) Patent No.: US 6,268,608 B1
(45) Date of Patent: Jul. 31, 2001

(54) METHOD AND APPARATUS FOR SELECTIVE IN-SITU ETCHING OF INTER DIELECTRIC LAYERS

(75) Inventor: Clive D. Chandler, Portland, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 09/169,566

(22) Filed: Oct. 9, 1998

(51) Int. Cl.[7] .................................................. H01J 37/305

(52) U.S. Cl. ........................................................ 250/492.2

(58) Field of Search .......................... 250/492.2, 492.3, 250/492.21, 309, 307, 310; 438/4, 619; 156/643.1; 216/37, 66; 427/552

(56) References Cited

U.S. PATENT DOCUMENTS

| | | | |
|---|---|---|---|
| 4,851,097 | 7/1989 | Hattori et al. | 204/192.33 |
| 5,009,743 | 4/1991 | Swann | 156/643 |
| 5,055,696 | * 10/1991 | Haraichi et al. | 250/492.2 |
| 5,093,572 | 3/1992 | Hosono | 250/310 |
| 5,188,705 | 2/1993 | Swanson et al. | 156/643 |
| 5,576,542 | 11/1996 | Kaga | 250/310 |
| 5,616,921 | * 4/1997 | Talbot et al. | 250/492.21 |
| 5,683,547 | 11/1997 | Azuma et al. | 156/643.1 |
| 5,705,443 | 1/1998 | Stauf et al. | 438/722 |

(List continued on next page.)

FOREIGN PATENT DOCUMENTS 0 774 778 A2   5/1997   (EP) .

OTHER PUBLICATIONS

Tu, Yung–Yi, et al.., Chemical Sputtering of Fluorinated Silicon , *Physical Review B*, vol. 23, No. 2, Jan. 15, 1981, pp. 823–835.

Winters, Harold F. and Coburn, J.W., "Surface Science Aspects of Etching Reactions", *Surface Science Reports*, vol. 14, Nos.4–6, Feb. 1992, pp. 163–265.

Jin Changming et al: "Deposition and Characterization of Porous Silica Xerogel Films", *Low–Dielectric Constant Materials II. Symposium*, Boston, MA, USA, Dec. 2–3, 1996, pp. 99–104.

E.M. Zielinski, et al., "Damascence Integration of Copper and Ultra–Low–k Xerogel for High Performance Interconnects," Semiconductor Process and Device Center, Texas Instruments [undated].

Stark, T.J., et al., "$H_2O$ enhanced focused ion beam micromachining," J. Vac. Sci. Technol. B. 13(b), Nov./Dec. 1995, pp. 2565–2569.

S.X. Li, et al., "How to Decorate FIB Cross Sections Using Plasma Etch for SEM Observation," *ISTFA '95*, 21st International Symposium for Testing and Failure Analysis, Nov. 6–10, 1995, Santa Clara, CA (pp. 347–351).

Jacques Favaron, "Plasma Delineation of Silicon Chip Cross Sections," ISTFA90, (pp. 117–120) undated.

(List continued on next page.)

*Primary Examiner*—Kiet T. Nguyen
(74) *Attorney, Agent, or Firm*—Michael O. Scheinberg

(57) ABSTRACT

A method and apparatus for selectively etching interlayer dielectrics (ILDs) using a focused ion beam and an etch-assisting gas are described. The method and apparatus can be used to distinguish ILDs in imaging or to etch ILDs without etching other layers. The etch-assisting gas molecule includes an etching portion that forms volatile compounds with the substrate upon when a reaction is initiated by the ion beam and a functional group that increases the stickiness of the molecule so that a sufficient number of molecules are adsorbed on the surface.

37 Claims, 6 Drawing Sheets

U.S. PATENT DOCUMENTS

| | | | |
|---|---|---|---|
| 5,723,366 | 3/1998 | Suzuki et al. | 437/228 |
| 5,741,727 | 4/1998 | Wang | 438/4 |
| 5,814,238 | 9/1998 | Ashby et al. | 216/62 |
| 5,840,630 | 11/1998 | Cecere et al. | 438/712 |
| 5,854,488 | 12/1998 | Aita | 250/309 |
| 5,871,659 | 2/1999 | Sakano et al. | 216/79 |
| 5,874,011 | 2/1999 | Ehrlich | 216/65 |
| 5,897,740 | 4/1999 | Tamura | 156/345 |
| 5,904,566 | 5/1999 | Tao et al. | 438/689 |
| 5,906,948 | 5/1999 | Liu et al. | 438/689 |
| 6,033,993 * | 3/2000 | Love, Jr. et al. | 438/745 |

OTHER PUBLICATIONS

Hyun–Ho Doh, et al., "Mechanism of selective $SiO_2/Si$ etching with flurocarbon gases ($CF_4$, $C_4F_8$) and hydrogen mixture in electron resonance plasma etching system," *J. Vac. Sci. Technol. A.* 14(5), Sep./Oct. 1996 (pp. 2827–2834).

D.M. Thaus, et al., "Development of focused ion–beam machining techniques for Permalloy structure," *J. Vac. Sci. Technol. B.* 14(6), Nov./Dec. 1996, pp. 3928–3932.

* cited by examiner

METHOD AND APPARATUS FOR SELECTIVE IN-SITU ETCHING OF INTER DIELECTRIC LAYERS

BACKGROUND OF THE INVENTION

This invention relates to chemically enhanced ion beam etching, and in particular, to using a focused ion beam to selectively etch inter layer dielectrics deposited during integrated circuit fabrication.

Integrated circuits are fabricated by growing, depositing, diffusing, and etching thin layers of conductors, insulators, and semiconductors onto a substrate of a semiconductor material, such as silicon or gallium arsenide wafer. To keep the fabrication processes operating properly, or to diagnose and correct the process when a defect does occur, process engineers must be able to quickly examine the various processed layers.

A primary tool used for examining, analyzing, and repairing processing layers is a focused ion beam (FIB) system. FIB systems improve manufacturing yields by identifying and analyzing defects on in-process wafers, allowing the source of defects to be located and corrected. For example, layers can be sputter-etched by an FIB system to expose underlying layers for observation and testing, or cross sections can be cut to expose the edges of multiple layers to observe layer thickness, uniformity, and inclusions. FIB systems can also form images of microscopic features and can be used to repair or test integrated circuits by depositing conductive or insulating material.

The processing layers exposed by the removal of covering material using FIB etching can be examined either using the imaging capability of the FIB system, or using a scanning electron microscope (SEM). The electron beam of an SEM causes less sample damage than does the ion beam of an FIB system, and the SEM is typically capable of forming a higher resolution image. SEMs are often available within the same vacuum chamber as an FIB system, such as in the DualBeam™ family of FIB Systems from FEI Company, the assignee of the present invention. In such a system, a cross section of the processing layers can be milled and then observed within the same vacuum chamber, with little or no movement of the sample. Such a system is particularly well suited to process control applications, where specimens must be analyzed quickly to provide feedback to a production line.

Many of the layers in an integrated circuit are composed of relatively non-conductive materials that are used to separate conductive layers or as passivation and protection Layers for the chip. Such layers are known as interlayer dielectrics (ILDs). ILDs include deposited oxides of various densities, thermal oxides, spun on glass, and nitrides. When ILDs are cross-sectioned with a focused ion beam and viewed, it is often impossible to distinguish among them. Thus, individual layer thickness cannot be determined and process engineers cannot isolate defects to a particular layer.

To distinguish between different ILD layers, it has been necessary to remove the specimen from the vacuum chamber and etch it in a bath of wet chemicals, such as ammonium fluoride ($NH_4F$) and hydrofluoric acid (HF), or a combination of $NH_4F$, HF, and acetic acid. The wet etching process etches the various layers slightly differently, so that upon rinsing, cleaning, and re-inserting into a vacuum chamber, the different layers can be viewed. Unfortunately, the time required to perform the multitude of steps involved in this process makes it unsuitable for real-time process control. Moreover, the etching of a chemical bath cannot practically be limited to the area of interest; the entire wafer must be etched to increase the contrast in a cross section of a single device of interest.

It has also been found that plasma etching using gases such as $CF_4$ and $C_4F_8$, enhances the contrast between the layers that were exposed by focused ion beam milling. Plasma etching is performed in a plasma chamber associated with a plasma-generating device. As in the wet chemical process described above, it is necessary to remove the specimen from the FIB vacuum chamber, place it in the plasma chamber for etching, and then place it in another high vacuum imaging instrument, such as a scanning electron microscope, for observation. The time required to switch between machines makes the plasma etching process for contrast enhancement unsuitable for production support when process engineers need answers quickly to keep a fabrication line running smoothly.

SUMMARY OF THE INVENTION

Accordingly, it is an object of the present invention to provide an improved method and apparatus to selectively etch materials using a charged particle ion beam.

It is an object of the present invention to provide an improved method and apparatus to selectively etch ILD materials using a charged particle beam.

It is another object of the invention to provide additional compounds for charged particle beam etching by modifying etchant compounds to increase their adsorption onto the surface.

It is a further object of the invention to provide an improved method and apparatus to distinguish ILD layers in an integrated circuit cross section milled by a focused ion beam.

It is yet another object of the present invention to provide such a method and apparatus that does not require the specimen to be removed from the vacuum chamber.

It is still another object of the present invention to provide an improved method and apparatus for defect analyses in semiconductor integrated circuits.

It is yet a further another object of the present invention to provide an improved method and apparatus for process control in integrated circuit semiconductor manufacturing.

It is still a further object of the invention to provide rapid analysis of semiconductor processing steps by selectively delineating or removing dielectric layers.

In accordance with the invention, molecules of an etch-assisting gaseous compound are adsorbed onto the surface of a specimen in a charged particle beam system. The gas causes different materials on the specimen to be etched at different rates in the presence of the charged particle beam. Such selective etching provides an observer with a sharp, clean cross section that allows the various layers in the cross section to be distinguished by an observer. The selective etching also allows the removal of some materials without significantly affecting other materials on a sample.

A molecule of the etch-assisting gaseous compound preferably includes an etching portion and a functional group to increase the stickiness of the molecule and enhance adsorption. It is believed that the gas is adsorbed onto the surface of the exposed layers and the charged particle bombardment provides energy to initiate a reaction of the adsorbed gas molecule with the surface material to be etched. The reaction produces volatile products that dissipate in the vacuum chamber, thereby removing material from or etching the specimen.

The etch rate is thought to vary for different materials because the strength of the etch reaction may vary with different materials, the sticking coefficient of the gas may be different for different materials, and the reaction products may be different and have different degrees of volatility. The gas may inhibit the etching of some materials by producing a reaction product that is not volatile and that forms a protective film over the second layer.

A preferred gaseous compound for practicing the invention comprises a halogenated hydrocarbon with an added functional group to enhance adsorption. For example, 2,2, 2-trifluoroacetamide selectively etches ILD layers so that they can be distinguished by an observer using SEM or FIB imaging, yet forms a protective film that inhibits further etching on silicon, either single- or poly-crystalline, and metallic layers.

In one preferred application, a cross section of the various layers of an integrated circuit is exposed using a liquid metal gallium focused ion beam. After the cross section is exposed, the specimen is tilted and the exposed cross section is ion-beam etched in a second etch step while a gas, such as 2,2,2-trifluoroacetamide, is directed at the surface. The gas preferentially assists the ion beam etching, thereby increasing the contrast between or delineating the ILD layers. The second etch step is typically briefer and uses a lower current density that the first etch step.

In a second preferred application, a layer of a dielectric material, such as silicon oxide, can be removed to expose a layer of underlying material, such as a polysilicon conductor. The dielectric layer is etched by exposure to an ion beam with a gas such as 2,2,2-trifluoroacetamide directed at the area of impact of the gallium ions. The dielectric layer is removed by the etch, whereas the underlying layer is essentially unaffected, thereby exposing the underlying layer for further analysis. The gas reacts with some underlying materials to form a protective film that inhibits further reaction with the underlying material.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

The system according to a preferred embodiment of the present invention includes a charged particle beam system that includes a gas injection system for injecting a gaseous component toward the area of the specimen surface impacted by the beam.

Figure 1:
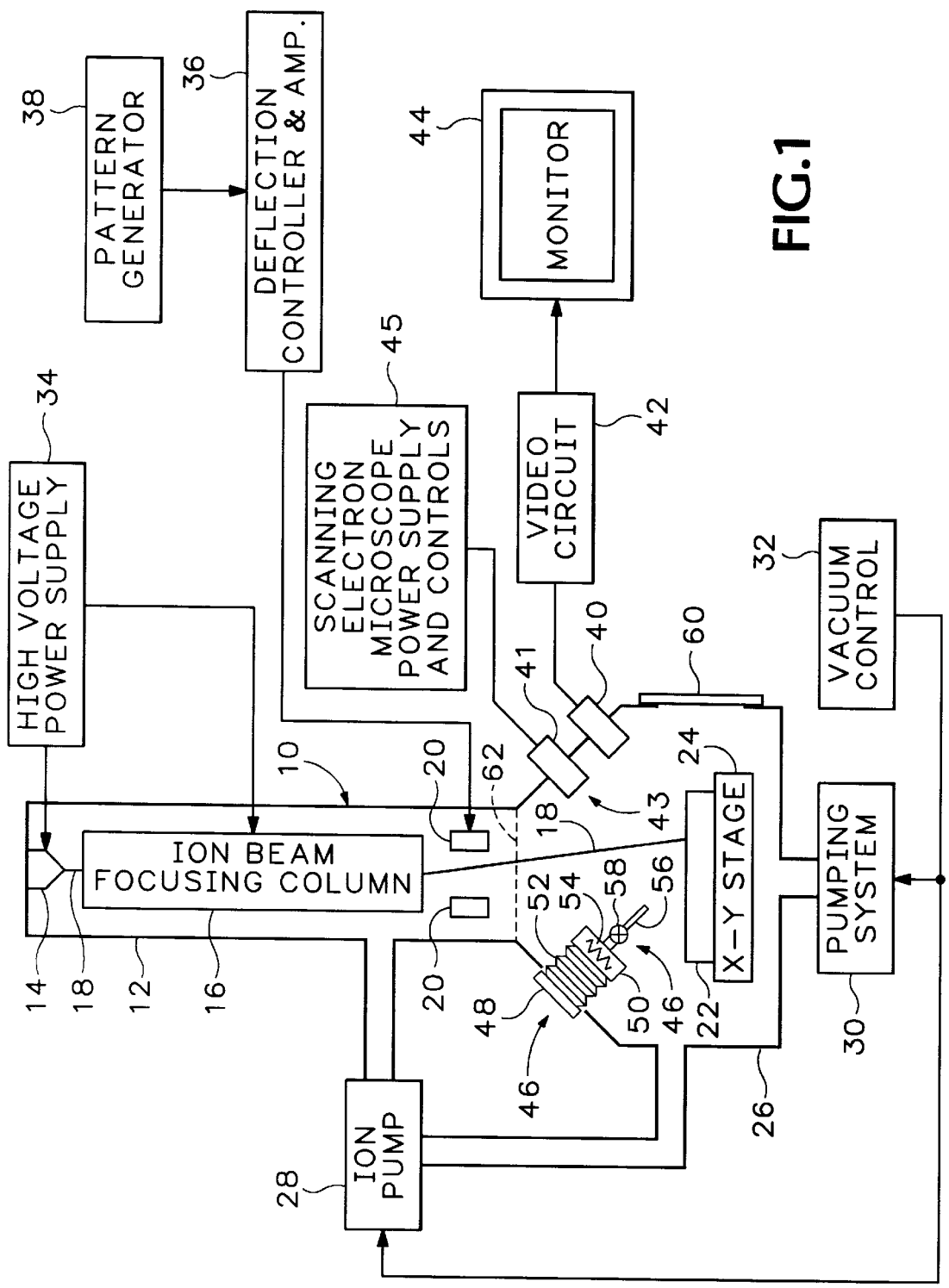
FIG. 1 is schematic representation of a focused ion beam system for etching in accordance with the present invention.

Referring to FIG. 1, illustrating a focused ion beam system for carrying out the present invention, an evacuated envelope 10 includes an upper neck portion 12 within which are located a liquid metal ion source 14 and a focusing column 16 which includes extractor electrode means and an electrostatic optical system. Ion beam 18 passes from source 14 through column 16 and between electrostatic deflection means schematically indicated at 20 toward sample 22, which suitably comprises a semiconductor device positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32.

High voltage power supply 34 is connected to liquid metal ion source 14 as well as to appropriate electrodes in focusing column 16 for forming an approximately 30 keV ion beam 18 and directing the same downwardly. Deflection controller and amplifier 36, operated in accordance with a prescribed pattern such as a raster pattern provided by pattern generator 38, is coupled to deflection plates 20 whereby beam 18 may be controlled to trace out a corresponding pattern on the upper surface of sample 22.

The source 14 typically provides a metal ion beam of gallium (although other metallic ions can be used, for example indium or aluminum). The source is capable of being focused into a sub 0.1 micron width beam at sample 22 for either modifying the surface 22 by providing an insulating layer or a metal layer or for the purpose of imaging the surface 22. An electron multiplier 40 used for detecting secondary emission for imaging is connected to video circuit and amplifier 42, the latter supplying drive for video monitor 44 also receiving deflection signals from controller 36.

Evacuated envelope 10 preferably also includes a scanning electron microscope (SEM) 43 that can be used to view the results of operations performed by the focused ion beam or that can perform electron beam processing. SEM 43 includes an electron beam generator 41 and associated power supply and controls 45. A preferred focused ion beam system that includes a SEM is the DualBeam™ XL860 model from FEI Company, the assignee of the instant invention.

A gas source 46 is located inwardly of the side of chamber 26 by translation device 48 adapted for positioning said source via support means within bellows 52. Source 46 includes a reservoir 50 and a heater 54, which may comprise a membrane type heater and which may be used for raising the temperature of a compound within reservoir 50 to a temperature for providing a suitable vapor pressure as hereinafter more fully disclosed. A transfer tube or nozzle 56 comprising a capillary tube provided by a hypodermic needle extends from reservoir 50 and is connected thereto via control valve 58 adapted for releasing gaseous vapor. The nozzle is extended and translated in orthogonal directions substantially perpendicular to its axis employing translation apparatus 48, so that gaseous vapor can be aimed directly toward a region on the top surface of sample 22.

A door 60 is opened for inserting sample 22 on stage 24 which may be heated, and also for servicing the reservoir 50. The door is interlocked so that it cannot be opened if the temperature in reservoir 50 is substantially above room temperature. A gate valve, schematically illustrated at 62, is closed before door 60 can be opened to seal off the ion source and focusing column apparatus.

Figure 2:
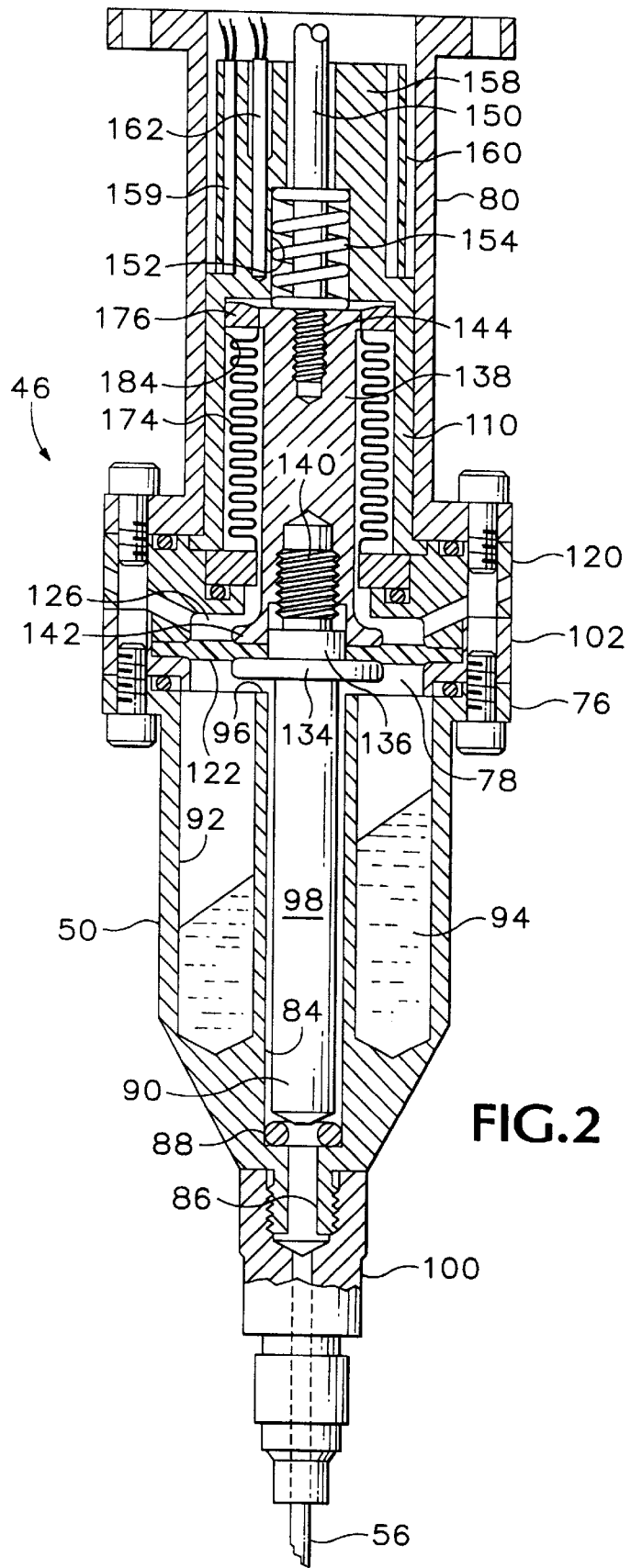
FIG. 2 is a partial cross-sectional view of a gas containment apparatus employed for injecting gas toward a substrate inside the FIB system of FIG. 1.
Figure 3:
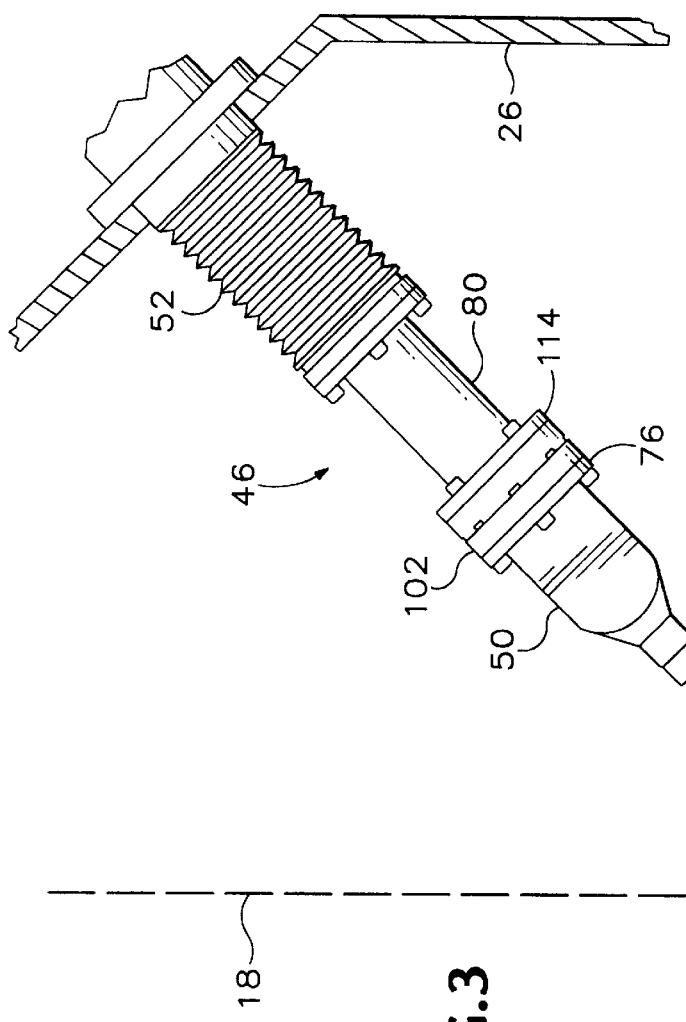
FIG. 3 is a partial, enlarged side view, broken away, of the gas injection system of FIG. 1.
Figure 4:
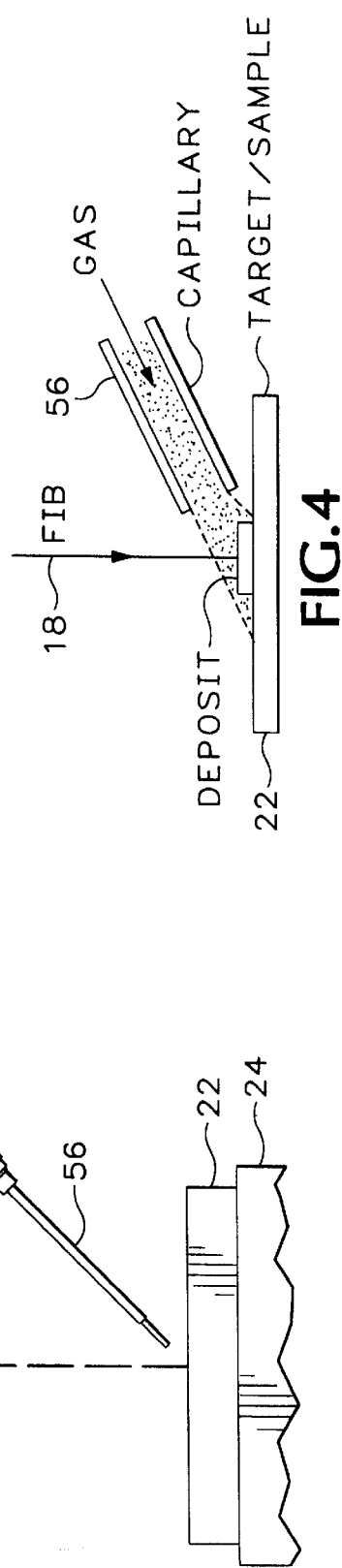
FIG. 4 is a further enlarged schematic side view of the gas injection nozzle of FIG. 3.

When reservoir 50 is raised to a desired temperature for vaporizing the compound within reservoir 50, valve 58 may be opened by withdrawing actuator rod 150 (FIG. 2) from outside the apparatus to open and regulate the position of valve plunger 40, while the nozzle 56 is directed towards the desired area of the sample as shown enlarged in FIG. 3 and further enlarged in FIG. 4. Bellows 52 accommodates movement of the nozzle assembly and reservoir relative to the sample without affecting the vacuum within chamber 26.

The vacuum control system along with the heater of gaseous vapor source 46 are operated to provide an appropriate vapor pressure condition for establishing a gaseous vapor flux in chamber as directed toward substrate 22 for etching or depositing material. To establish a given gaseous flux, the reservoir is heated to a predetermined temperature.

The high voltage power supply provides an appropriate acceleration voltage to electrodes in ion beam column 16 for energizing and focusing ion beam 18. When it strikes the sample having condensed gaseous vapor adhered thereupon, the ion beam provides energy for initiating a reaction between the etch-enhancing gaseous compound and the substrate and for sputter etching the sample.

Deflection controller and amplifier 36 causes the ion beam to be deflected in a desired pattern but wherein deflection of the ion beam is at a rate slow enough for etching sample 22. Considerations regarding deflection speed, loop time, etc. are well understood by those skilled in the art.

As hereinbefore mentioned, the vacuum system provides a vacuum of between approximately $1 \times 10^{-6}$ Torr and $5 \times 10^{-4}$ Torr within chamber 26. With emission of gaseous vapor, the chamber background pressure is suitably about $1 \times 10^{-5}$ Torr. In an exemplary embodiment, the gaseous source 46 is heated to a temperature for providing a gaseous flux of roughly $1 \times 10^{16}$ to $1 \times 10^{17}$ molecules per second per square centimeter via the capillary tube of the hypodermic needle, while the metal ion source and focusing column are suitably controlled for generating a flux of $1 \times 10^{13}$ to $1 \times 10^{15}$ charged particles per second per square centimeter within the rastered area. Skilled persons can readily determine appropriate pressures and gas flows for any particular application.

U.S. Pat. No. 5,435,850 to Rasmussen for a "Gas Injection System" assigned to the assignee of the present invention discloses an apparatus for introducing and directing gaseous vapor toward sample 22. Referring to FIG. 2 of the present application, the vapor source comprises the reservoir 50 within which the compound to be vaporized is received, the lower end of the reservoir being provided with nozzle 56 in the form of hypodermic needle 56 providing a capillary tube having a small orifice for directing gas toward substrate 22. The hypodermic needle is attached to the threaded lower end of reservoir 50 by lock fitting 100. Upper flange 76 of reservoir 50 is secured to the periphery of sealing chamber 78, the latter depending ultimately from support tube 80. Support tube 80 is attached with screws to the lower end of bellows 52 as well as to positioning mechanism (not shown) within the bellows.

Reservoir 50 comprises a solid metal block elongated in a direction longitudinal of hypodermic needle 56 and provided with a central cylindrical passage 84 through which gas passes to the hypodermic needle. At its lower end, the longitudinal passage 84 narrows at 86, forming a shoulder for receiving O-ring valve seal 88 that cooperates with the tapered end of valve plunger 90 for regulating the flow of gas from passage 84 to nozzle 56. Plunger 90 is located at the lower end of actuator 98, the latter comprising a rod disposed coaxially within passage 84 and extending back through the passage. The outer diameter of actuator 98 is less than the inside diameter of passage 84 in order to form a channel for the delivery of gas.

Around central passage 84 in reservoir 50 are disposed a plurality of elongated cylindrical chambers 92 parallel to and in substantially surrounding relation with cylindrical passage 84, each chamber 92 comprising a longitudinal bore in the reservoir block 50 adapted to receive vaporizable material 94, such as 2,2,2-trifluoroacetamide as hereinafter further described. The upper end 96 of the reservoir is open to sealing chamber 78 wherein gas generated within the reservoir chamber is communicated to central passage 84.

Center rod extension 138 is threadably engaged at 140 by the end of actuator 98 whereby the center of membrane 122 is sealingly disposed between flange 134 and head 142 of center rod extension 138. Metal bellows 174 separates region 126 above membrane 122 from atmospheric pressure within support tube 80. The bellows 174 extends between rings 170 and 176, the former being locked between spacer ring member 120 and heat sink 110, while the Latter is secured to the upper end of center rod extension 138 proximate the end of cavity 184 of sink 110 within which it slides as rod 150 is moved against the bias of spring 154 to open and close the valve comprising plunger 90 and O-ring 88.

Membrane 122 defines the upper wall of sealing chamber 78 and a lower wall of region 126 which is vented to chamber 26. Actuator 98 includes a radial flange 134 within chamber 78 for centrally engaging the membrane 122 which is peripherally held, while portion 136 of the actuator passes through a central aperture in membrane 122 and into a recess within the head end of center rod extension 138. Actuator 98 has a threaded portion 140 adapted to engage a mating thread in center rod extension 138.

The center rod extension 138 is provided with an upper internal threaded portion 144 mating with threads 14 at the lower end of actuating rod 150. Rod 150 is adapted to receive linear motion under the control of means within the positioning mechanism inside bellows 52 in FIG. 1 or therebeyond. Upper cavity 152 in heat sink 110 houses spring 154 acting between the heat sink and the upper end of center rod extension 138 so that the center rod extension and attached parts including actuator 98 are normally biased in a direction for closing plunger 90 against O-ring 88 to close off the flow of gas. However, when rod 150 is pulled upwardly (by means not shown) the valve is opened as center rod extension 138 and ring 176 slide within lower recess 184 in heat sink 110. The membrane 122 flexes with movement of the actuator.

Upper end portion 158 of heat sink 110 is of reduced cylindrical diameter and receives therearound a band heater 159 provided electrical current by means not shown, the heater being covered and held in place by shrink band 160. A thermistor 162 is embedded within portion 158 of the heat sink, and when electrical current is supplied to band heater 159, the thermistor 162 provides feedback to a control circuit for regulating the temperature of the heat sink at a desired elevated level for heating the reservoir 50 and the material therewithin. The heater and control therefor are conveniently located outside the vacuum region of chamber 26 eliminating electrical feedthroughs, but the heat generated is conducted via the vacuum wall to the reservoir.

The gas injection system 46 forms a housing providing an enclosure for generating and containing gas therewithin, the enclosure including chambers 92 and central passage 84 of reservoir 50 as well as sealing chamber 78 surrounded by the lower end of sealing member 102. The gas tight enclosure additionally comprises the flexible rubber membrane 122 clamped between sealing member 102 and spacer ring member 120 at the periphery thereof, while also being centrally clamped in sealing relation to actuator 98 between actuator flange 134 and the head 142 of center rod extension 138 as previously mentioned.

Figure 5:
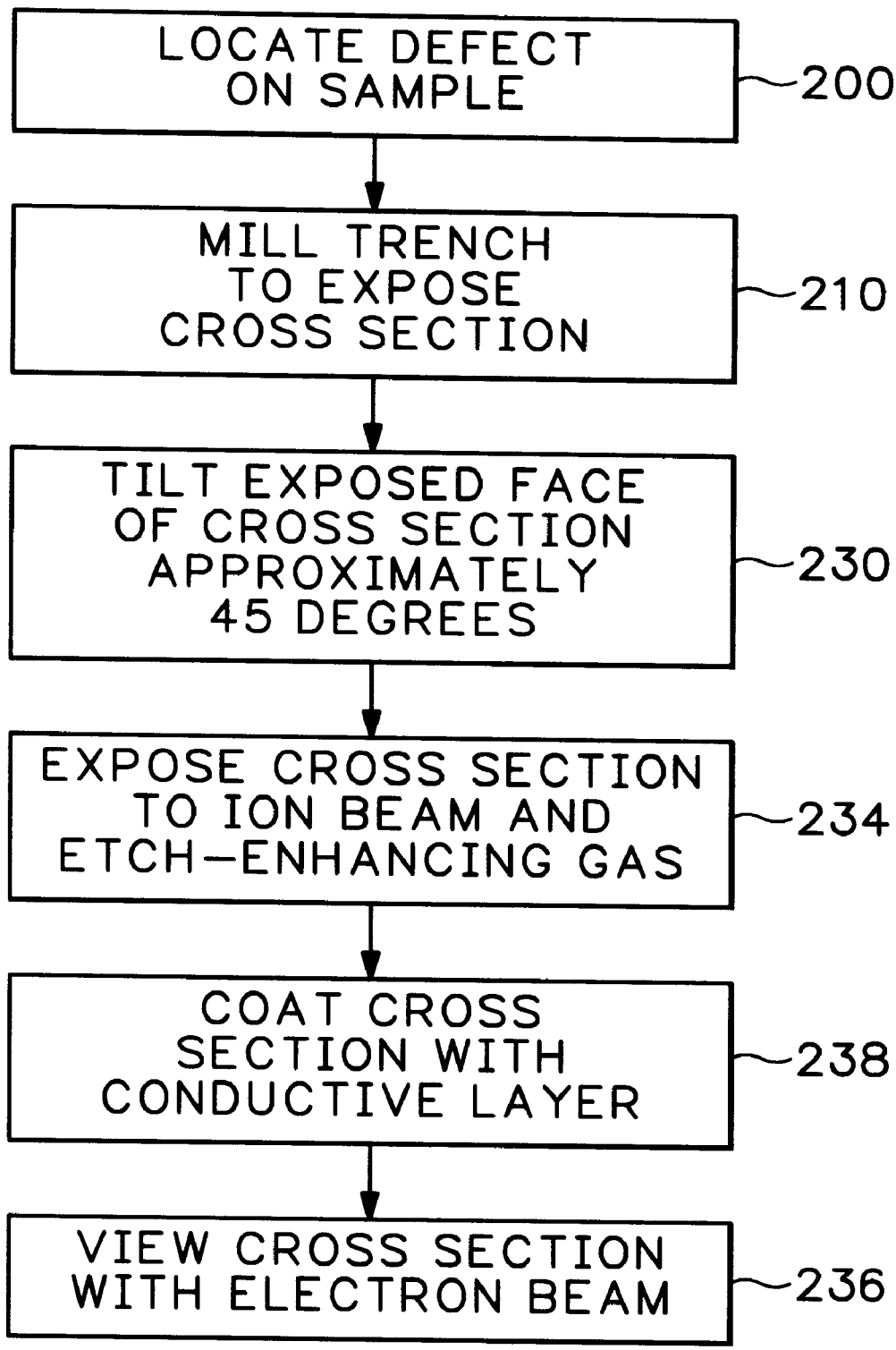
FIG. 5 is a flow chart showing the steps of a preferred embodiment of a the present invention.
Figure 6:
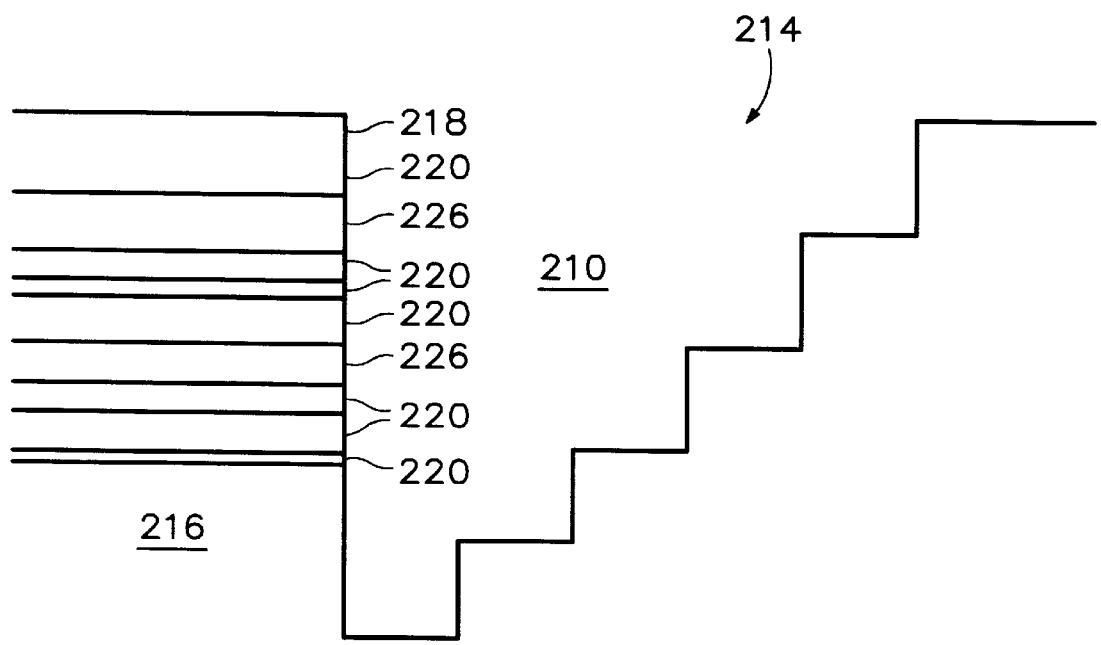
FIG. 6 is a schematic representation of a trench milled in an integrated circuit using the apparatus of FIG. 1.

FIG. 5 is a flow chart showing the steps of a typical defect analysis application of the present invention. Step 200 shows that an engineer locates the defect on the integrated circuit sample. The defective element may be located, for example, by its failure during electrical testing. Step 202 shows that a trench 210, as shown in FIG. 6, is milled in an integrated circuit 214 on a silicon substrate 216 to expose a cross-sectional face 218 of ILD layers 220 and metal layers 226. The edges of ILD layers 220 and metal layers 226 are exposed in cross sectional face 218. The trench is milled relatively quickly using a beam of preferably about 5 nanoamps, depending on the size of the trench being milled, to provide a current density of approximately 2 $\mu Coul/\mu m^2$.

The ILD layers may include, for example, silicon oxides, silicon nitrides, low dielectric constant (k) dielectrics, spun-on glasses, polymers, and other similar materials. Etching other dielectric materials, such as passivation layers, are also within the scope of the invention and the term ILD used herein can include such other layers. Skilled persons will recognize that each of these materials can be deposited using various methods that impart to the layer properties that are required for the functioning of that particular layer. For example, a thin silicon oxide layer used as part of a gate in a transistor (a gate oxide) will typically be deposited by a different process and be much denser than a thicker, less dense layer of PE CVD oxide used between two metallic conductors.

Figure 7:
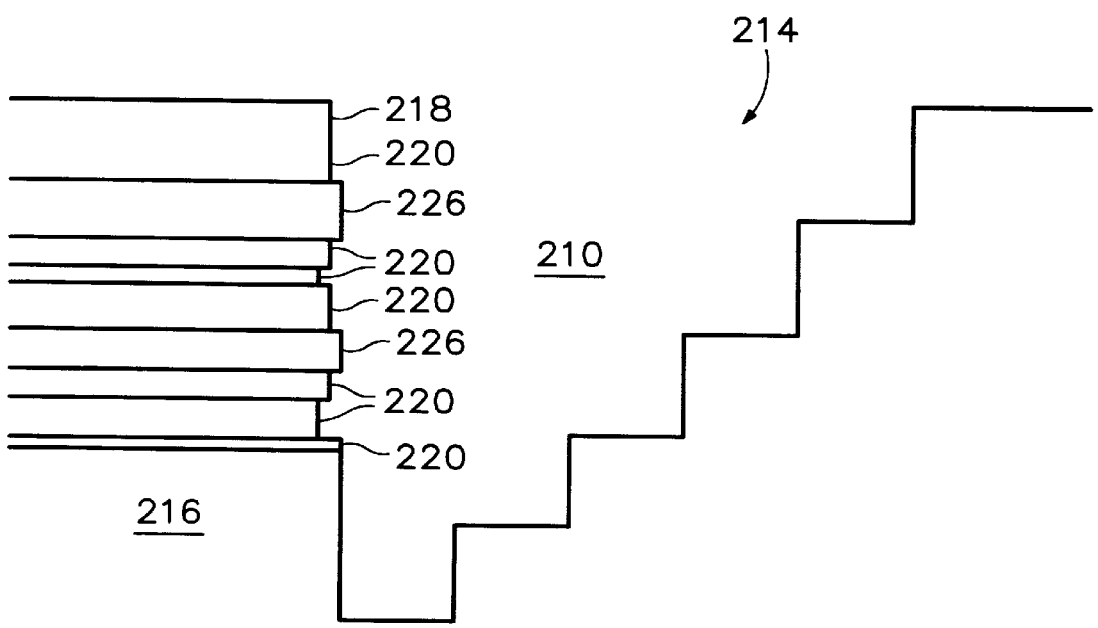
FIG. 7 is a schematic representation of the trench of FIG. 6 after etching in accordance with the invention.

After trench 210 is initially milled, step 230 shows that the sample is tilted approximately 45 degrees to present face 218 to the focused ion beam. Step 234 shows that face 218 is etched at a lower beam current in the presence of an etch-enhancing gaseous compound that selectively etches exposed layers 220 so that an observer can distinguish among the layers. FIG. 7 illustrates in an exaggerated manner how etching face 218 in accordance with the invention allows ILD layers 220 to be distinguished by a viewer.

The ion-beam etching step 234 is relatively brief, lasting approximately two minutes, and removes only a few nanometers of material. A typical beam current, which will vary with the size of the cross section, is 11 picoAmps, which produces a beam current density of approximately 15 to 20 $nCoul/\mu m^2$. Higher current densities could be used in step 234, but currents as high as 25–30 $nCoul/\mu m^2$ begin to cause distortion in the cross-section face 213.

The energy in the ion beam is typically between 30 keV and 50 keV, although ion beam energy of less than 30 keV could be used. Ion beams at 30 keV result in less sputtering than higher energy ions, thereby reducing the non-selective removal of material and increasing the contribution of the gas to the removal of surface material. Skilled persons can readily adjust the etch time, gas flow, and ion beam characteristics to suit the particular materials and size of the cross section being exposed.

Step 236 shows that the cross section face 218 is viewed, preferably using SEM 43. Cross section face 218 can also be viewed using the imaging capability of the FIB system. The inventive process provides a sharp, clear image of the cross section face 218 so that a user can identify defects or irregularities in the exposed layers.

Optional step 238 shows that before imaging the cross-sectional face 218 by SEM 43, the cross section face 18 is coated with a thin conductive coating to improve the image by reducing beam-induced charging. The coating, which can include, for example, carbon or a metal such as platinum, and is preferably deposited using charged particle beam assisted deposition. For example, after the chemically assisted etching to delineate the ILDs, a needle 36 connected to a reservoir 50 containing a platinum compound, such as methylcyclopentadienyl trimethyl platinum, could be inserted into lower chamber 26, while the cross section is bombarded again with the ion beam to deposit a few atomic thicknesses of the conductor. Alternatively, the conductive coating can be deposited by charged particle beam assisted deposition using the electron beam of SEM 43, which would damage the substrate less than would ion-beam induced deposition.

The etch-assisting gas used in the invention comprises a gaseous compound that will etch the different layers in a different manner so as to allow the layers to be distinguished upon observation. The gaseous compound may etch the different layers at a different etching rates or may merely produce different surface appearances or textures on different materials. To expedite transport of the compound into the vacuum chamber and to the substrate surface, the etch-assisting compound is preferably in the gas phase at or near room temperature and at the pressures present in the focused ion beam vacuum chamber. The gas preferably combines with the material to be etched to produce volatile compounds that will not remain on the surface of the substrate. The volatile reaction products will migrate into the vacuum chamber and be removed.

The gaseous compound preferably is characterized by a sticking coefficient that is sufficiently high to ensure that molecules will adhere to the substrate surface in sufficient concentrations to react with the surface molecules in the presence of the ion beam. One method of ensuring an adequate sticking coefficient is to attach a functional group onto a molecule that etches the substrate layers in the presence of the ion beam.

A preferred gas, 2,2,2-trifluoroacetamide ($CF_3CONH_2$),

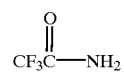

includes the functional amido group that is believed to enhance the stickiness of the compound. 2,2,2-trifluoroacetamide is a solid at room temperature and is heated to approximately 30 degrees Celsius in a gas injection system. The $CF_3$ portion of the molecule or the fluorine that is liberated in the reaction with the ion beam is believed to be responsible for the etching. Other similar compounds, such as trifluoroacetic acid ($CF_3COOH$)

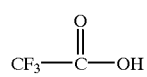

and pentafluoropropionic acid ($CF_3CF_2COOH$),

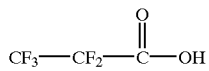

can also be used to implement the present invention. Also thought to be usable are compounds such as trifluoroacetyl fluoride ($CF^3COF$)

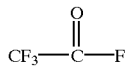

3,3,3-trifluorolactic acid ($CF_3COHCOOH$)

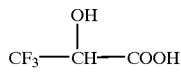

and hexafluoroacetone ($CF_3C[O]CF_3$)

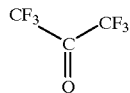

The gaseous compound preferably has little or no reaction with the substrate in the absence of the charged particle beam. The pressure of the gaseous compound at the substrate where the ion beam impinges is preferably about $10^{-3}$ mBar, which is thought to be insufficient pressure for a gas phase interaction with the ion beam. The gas flow will depend upon the application, but in many applications the flow is preferably around $2.5 \times 10^{-7}$ moles per second. Thus, it is assumed that the molecules are adsorbed onto the specimen surface and react in the solid state when energy is provided by the ions impacting the specimen.

When the preferred etch-assisting gaseous compound 2,2,2-trifluoroacetamide etches layers of silicon oxides in the presence of an ion beam, the oxygen in the oxide material is thought to form a volatile compound, such as $CO_2$ or $CO$, with the carbon freed as the etch assisting gas compound reacts with the silicon oxide, thereby removing the carbon from the surface. Similar volatile compounds, such as $H_2O$, $NH_2$, and $OCNH_2$, are formed during the reaction of the gaseous compound with the substrate. When etching nitride layers, volatile products include $SiF_2$, $SiF_4$ and $N_2$. The volatile compounds are eventually evacuated by the vacuum pump.

Sample materials that do not provide oxygen or another material with which to form volatile compounds to liberate the carbon have deposited upon them a film including the carbon and fluorine. Such materials include single crystal silicon, poly-crystalline silicon, and metals. The deposited film inhibits further etching of the silicon, thereby greatly enhancing the selectivity of etching silicon oxides over silicon and metals. The process can be use to deposit a protective film onto silicon or similar materials. Other compounds, such as perfluorooctanoic acid, $(CF_3)_8COOH$, are efficient at depositing carbon bearing films, because of the large amount of carbon present in each molecule. To avoid depositing films, it preferable to have a simple etching portion of the molecule, such as a single $CF_x$.

Figure 9:
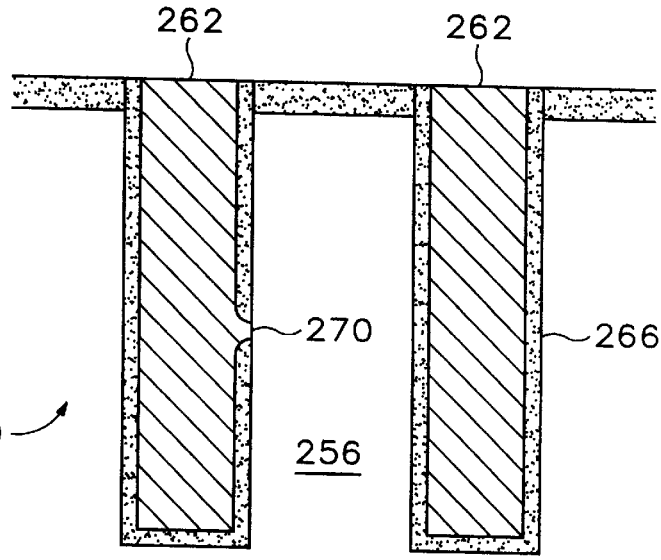
FIG. 9 is a schematic representation of a defective trench capacitor.
Figure 8:
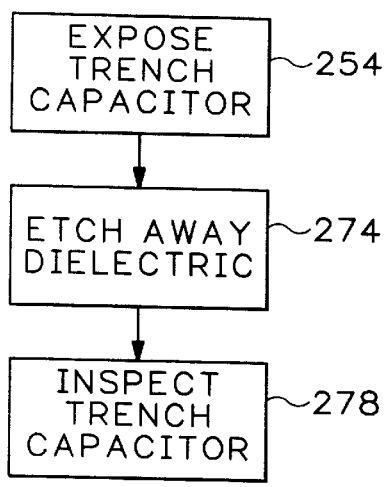
FIG. 8 is a flow chart showing the steps of another application of the present invention.
Figure 10:
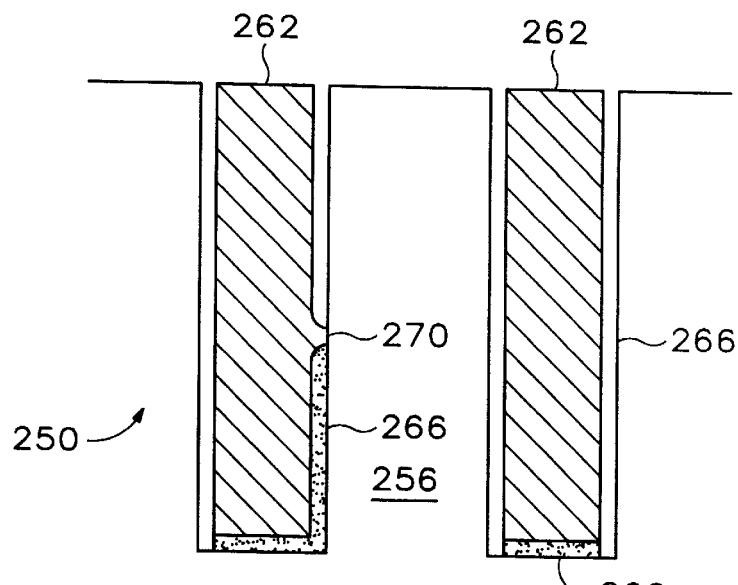
FIG. 10 is a schematic representation of the trench capacitor of FIG. 9 after being etched in accordance with the invention.

FIG. 8 is a flowchart showing a process of defect analysis for a trench capacitor. FIGS. 9 and 10 illustrate a trench capacitor 250 before and after processing in accordance with the invention. The defect analysis process of FIG. 8 uses the selectivity of the gas-enhanced charged particle beam etch to remove a first material while minimally affecting a nearby second material.

Step 254 shows that trench capacitor 250 is exposed by removing layers above it, preferably by ion beam milling. FIGS. 9 shows trench capacitor 250 formed by trenches that are filled with a conductive polysilicon material 262 and that are electrically isolated from the silicon substrate 256 by a silicon oxide dielectric 266. FIG. 9 shows a defect 270 in dielectric layer 266. When trench capacitor 250 is used, defect 270 will cause electrical charge to leak from the capacitor, causing it to fail.

Step 274 shows that silicon oxide dielectric 266 is etched in accordance with the invention, using a focused ion beam and an etch-enhancing gas such as 2,2,2-trifluoroacetamide. FIG. 10 shows trench capacitor 250 with silicon oxide dielectric 260 removed. The selectivity of the invention causes the oxide dielectric 266 to be etched at a much higher rate than polysilicon material 262. The silicon oxide material below defect 270 will not be removed, because polysilicon material 262, which is essentially unetched, will mask and therefore prevent the ion beam from etching the material beneath it. Step 278 shows that trench capacitor 250 is inspected and defect 270 is readily apparent to the viewer. Using the gaseous compound described above, it is possible to rapidly etch dielectric oxide layer 266 with little or no effect on the nearby polysilicon.

The prior art used a gas, such as $XeF_2$, to etch the oxide, but $XeF_2$ etched polysilicon conductors faster than it etched silicon oxide dielectric layers. When etching a dielectric layer to expose an underlying polysilicon layer, it was difficult, yet vital, to stop the etching process at the precise moment that polysilicon conductors was exposed to prevent etching of the polysilicon. With the selectivity of the invention, such precise timing is no longer necessary.

The gaseous compounds described above are illustrative and do not limit the scope of the invention. Other compounds will be useful in different applications. For example, chlorinated hydrocarbons, such as 2,2,2-trichloroacetamide

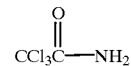

may be used for etching aluminum oxides. Chlorides are preferable for etching aluminum oxides because the etch product of fluorine and aluminum, aluminum fluoride, is not sufficiently volatile to evaporate from the substrate and be removed by the vacuum system. Tri-bromides may also be useful for etching other oxides of materials, such as $Al_2O_3$ or $GeC_4$. Each of these compounds may include, if necessary, functional groups that increase the sticking coefficient and therefore the adsorption of the molecules to the substrate surface.

Although the invention has a particularly useful application in selectively etching ILDs on semiconductors, the etch selectivity of the invention is useful in a wide variety of materials and applications, and is not limited to the applications and materials described above. Moreover, although the invention has been described with the use of a liquid metal focused ion beam, skilled persons will recognize that other charged particle beams, such as electron beams, may also be used without departing from the scope of the invention.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed is:

1. A method of distinguishing between dielectric layer in a cross section of an integrated circuit milled by a focused ion beam, comprising:

removing material from the integrated circuit to expose a cross-sectional surface of the dielectric layers to be observed;

directing a gas onto the exposed cross-sectional surface of the dielectric layers so as to adhere molecules of the gas onto the exposed surface of the dielectric layers; and directing a focused ion beam toward the exposed surface of the exposed dielectric layers, the gas causing the dielectric layers in the exposed cross section to be etched by the focused ion beam so as to increase the observable contrast between the exposed dielectric layers.

2. The method of claim 1 in which the gas comprises a halogenated hydrocarbon.

3. The method of claim 1 in which the gas comprises a fluorinated hydrocarbon.

4. The method of claim 3 in which the gas comprises a fluorinated hydrocarbon having a functional group to increase the adsorption of the gas molecules to the surface.

5. The method of claim 3 in which the gas comprises 2,2,2-trifluoroacetamide.

6. The method of claim 3 in which the gas comprises $CF_3COOH$ or $CF_3CF_2COOH$.

7. The method of claim 3 in which the gas causes at least some of the dielectric layers to be etched at different rates.

8. A method of focused ion beam etching to improve contrast between dielectric layers in an integrated circuit, comprising:

introducing a gas onto the surface of a specimen so as to adhere gas molecules onto the surface;

bombarding the specimen with a charged particle beam to etch the dielectric layers to increase the observable contrast between the dielectric layers; and observing the specimen.

9. The method of claim 8 in which the gas is a halogenated hydrocarbon.

10. The method of claim 8 in which the gas is a fluorinated hydrocarbon.

11. The method of claim 8 in which the gas comprises 2,2,2-trifluor-oacetamide.

12. The method of claim 8 in which the gas comprises $CF_3COOH$ or $CF_3CF_2COOH$.

13. A method of selectively etching a dielectric material on a specimen including a second material in addition to the dielectric material, comprising:

adsorbing molecules of a gas onto a surface of the specimen at substantially room temperature; and exposing the surface of the specimen to a focused ion beam, the focused ion beam inducing a reaction between the adsorbed gas molecules and the dielectric material, the reaction of the adsorbed gas molecules with the dielectric material etching the dielectric material preferentially compared to the etching of the second material, thereby removing a portion of the dielectric material, the second material being substantially unaffected by the focused ion beam.

14. The method of claim 13 in which the dielectric material comprises an oxide of silicon and in which the second material comprises semiconductor silicon.

15. The method of claim 13 in which the dielectric material comprises an oxide of silicon and in which the second material comprises a metallic material.

16. The method of claim 13 in which the adsorbed gas molecules decompose to form a layer cover the second material that inhibits its removal.

17. The method of claim 16 in which the layer includes carbon.

18. The method of claim 13 in which the gas comprises 2,2,2-trifluoroacetamide.

19. The method of claim 13 in which the gas comprises $CF_3COOH$ or $CF_3CF_2COOH$.

20. The method of claim 13 in which the gas comprises a halogenated hydrocarbon.

21. The method of claim 20 in which the gas comprises a fluorinated hydrocarbon.

22. A focused ion beam system for selectively etching compounds on a specimen surface, comprising:

a vacuum chamber;

a focused ion beam generator for generating a focused ion beam within the vacuum chamber;

a source of a fluorinated, chlorinated, or brominated hydrocarbon gas having functional groups to increase the adsorption of the gas molecules to a target surface; and a gas director for directing the fluorinated, chlorinated, or brominated hydrocarbon gas onto the substrate surface in the vicinity of impact of the focused ion beam, thereby enhancing ion-beam etching of the substrate.

23. The focused ion beam system of claim 22 in which the source of a fluorinated, chlorinated, or brominated hydrocarbon gas comprises a source of 2,2,2-trifluoroacetamide gas, the gas enhancing etching of a silicon oxide compound.

24. The system of claim 22 in which the source of a fluorinated, chlorinated, or brominated hydrocarbon gas comprises a source of 2,2,2-trichloroacetamide and the specimen surface includes an oxide of aluminum.

25. The system of claim 22 in which the source of a fluorinated, chlorinated, or brominated hydrocarbon gas comprises a source of a tri-bromide compound and the specimen surface includes an oxide of aluminum or germanium.

26. The system of claim 22 in which the gas comprises 2,2,2-trifluoroacetamide, $CF_3COOH$, $CF_3CF_2COOH$, or a tri-bromide compound.

27. A method for selectively etching compounds on a substrate, comprising:

bombarding the substrate compound with a focused ion beam;

exposing the substrate surface at the ion beam intersection to a fluorinated, chlorinated, or brominated hydrocarbon gas having a functional group to provide sufficient stickiness to adhere to the substrate surface; and forming volatile products between the substrate and the fluorinated, chlorinated, or brominated hydrocarbon gas.

28. The method of claim 27 in which the gas comprises 2,2,2-trifluoroacetamide, $CF_3COOH$, $CF_3CF_2COOH$, or a tri-bromide compound.

29. In a method of etching a sample in a charged particle beam system including directing a charged particle beam toward the sample and directing a gaseous compound toward the sample at the location of charged particle bombardment, the improvement comprising:

directing a fluorinated, chlorinated, or brominated hydrocarbon compound toward the sample at the location of charged particle bombardment so as to adsorb onto a surface of the sample molecules of a fluorinated hydrocarbon having a function group to enhance stickiness, and;

directing a charged particle beam so as to induce a reaction between the adsorbed gas molecules and a dielectric material on the sample, the reaction of the adsorbed gas preferentially etching the dielectric to enhance the charged particle beam etching compared to the etching of a second material on the sample, thereby removing the dielectric material while the second material is substantially unaffected by the focused ion beam.

30. The method of claim 29 in which directing a fluorinated, chlorinated, or brominated hydrocarbon gaseous compound toward the sample includes directing a gaseous compound including a 2,2,2-trifluoroacetamide toward the sample.

31. The method of claim 29 in which the fluorinated compound comprises $CF_3COOH$ or $CF_3CF_2COOH$.

32. The method of claim 29 in which the second material comprises silicon, polysilicon or a metallic material.

33. The method of claim 29 in which directing a charged particle beam comprises directing an electron beam or an ion beam.

34. In a charged particle beam system for etching a sample the charred particle beam system including a vacuum chamber having therein a source of charged particles, and a focusing device for focusing the charged particles into a beam for bombarding the sample, the improvement comprising having a source of a fluorinated, chlorinated, or brominated hydrocarbon gas for enhancing etching of the sample, the source of a fluorinated, chlorinated, or brominated hydrocarbon gas comprising a source of fluorinated, chlorinated, or brominated hydrocarbon gas molecules having functional groups to increase the adsorption of the gas molecules to the surface.

35. The system of claim 34 in which the gas comprises 2,2,2-trifluoroacetamide.

36. The system of claim 34 in which the gas comprises $CF_3COOH$ or $CF_3CF_2COOH$.

37. The system of claim 34 in which the charged particle beam comprises an electron beam or an ion beam.

* * * * *